United States Patent
Kobayashi

(10) Patent No.: US 6,787,471 B2
(45) Date of Patent: Sep. 7, 2004

(54) METHOD OF MANUFACTURING A SEMICONDUCTOR DEVICE

(75) Inventor: Hiromichi Kobayashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 38 days.

(21) Appl. No.: 10/184,898

(22) Filed: Jul. 1, 2002

(65) Prior Publication Data

US 2002/0168857 A1 Nov. 14, 2002

Related U.S. Application Data

(63) Continuation-in-part of application No. 09/261,162, filed on Mar. 3, 1999, now abandoned.

(51) Int. Cl.$^7$ .............................................. H01L 21/302
(52) U.S. Cl. ........................ 438/691; 438/692; 438/693; 438/700; 438/745
(58) Field of Search ................................ 438/691, 692, 438/693, 700, 745, 750

(56) References Cited

U.S. PATENT DOCUMENTS

| | | | |
|---|---|---|---|
| 5,436,488 A | * | 7/1995 | Poon et al. .................. 257/397 |
| 5,597,341 A | | 1/1997 | Kodera et al. |
| 5,643,406 A | | 7/1997 | Shimomura et al. |
| 5,728,308 A | | 3/1998 | Muroyama |
| 5,728,621 A | * | 3/1998 | Zheng et al. ................ 438/427 |
| 5,922,620 A | | 7/1999 | Shimomura et al. |
| 5,923,993 A | * | 7/1999 | Sahota ........................ 438/427 |
| 5,934,980 A | | 8/1999 | Koos et al. |
| 5,970,362 A | * | 10/1999 | Lyon et al. .................. 438/424 |
| 6,069,081 A | * | 5/2000 | Kelleher et al. ............. 438/692 |

FOREIGN PATENT DOCUMENTS

JP 09-051034 2/1997

* cited by examiner

*Primary Examiner*—Lan Vinh
(74) *Attorney, Agent, or Firm*—McDermott Will & Emery LLP

(57) ABSTRACT

A silicon nitride film is first formed on a semiconductor substrate and serves as a polishing stopper film. Then, the silicon nitride film and the semiconductor substrate are etched in a predetermined region to form an isolating trench which partitions an active region. Next, a silicon dioxide film is deposited on the semiconductor substrate so that the isolating trench is filled with the silicon dioxide film. Next, first-stage chemical mechanical polishing (CMP) is performed with a $SiO_2$-contained slurry which can efficiently polish the surface of the silicon dioxide film regardless of level difference. Finally, second-stage CMP is performed with a $CeO_2$-contained slurry ensuring a large polishing selectivity ratio of the silicon dioxide with regard to silicon nitride films.

25 Claims, 7 Drawing Sheets

METHOD OF MANUFACTURING A SEMICONDUCTOR DEVICE

RELATED APPLICATION

This application claims priority from and is a continuation-in-part application of U.S. patent application Ser. No. 09/261,162 filed on Mar. 3, 1999, now abandoned which is incorporated herein by reference.

BACKGROUND OF THE INVENTION

1. Field of the Invention

The present invention generally relates to a method of manufacturing a semiconductor device and, more particularly, to a manufacturing method suitable for forming efficiently a wiring pattern or an isolating trench which partitions an active region in a semiconductor substrate.

2. Description of the Background Art

Semiconductor integrated circuits (ICs) are required to be able to completely independently control individual devices. For this reason, in the fabrication of semiconductor ICs there is a need to form the structure having element isolating regions which prevent electrical interference among a plurality of devices. For example, trench isolation and localized oxidation of silicon (LOCOS) are widely known as the method for forming the aforementioned element isolating regions.

The trench isolation method is one which forms a trench in a semiconductor substrate and then fills the trench with an insulator to form an isolating region. According to the trench isolation method, a bird's beak, which will occur in the LOCOS method, will rarely occur. To accurately form the isolating region, it is undesirable for a bird's beak to occur. In this regard, the trench isolation method is an isolating-region formation method indispensable for advancing miniaturization of semiconductor ICs.

The tolerance for accuracy of lithography and etching that are performed in the semiconductor IC manufacturing process becomes less as miniaturization of semiconductor ICs advances. To enhance lithography accuracy and etching accuracy, it is important to ensure the planarization of a semiconductor IC in the manufacturing process. For this reason, in the process of forming an isolating region by the trench isolation method, chemical mechanical polishing (CMP) has been used extensively for planarizing a semiconductor IC favorably.

FIGS. 15A through 19B are sectional views for explaining the contents of a former trench isolation method that is performed in the IC manufacturing process. FIGS. 15A, 16A, 17A, 18A and 19A are sectional views showing a section where two isolating regions are provided adjacently to each other, while FIGS. 15B, 16B, 17B, 18B and 19B are show sectional views showing a section where a relatively large active region is formed near an isolating region.

In the former trench isolation method, as illustrated in FIGS. 15A and 15B, a silicon dioxide ($SiO_2$) film 12 and a silicon nitride (SiN) film 13 are formed in this order on a silicon substrate 10. Then, a layer of resist (not shown) is formed on the SiN film 13 by a photo-lithographic process. The resist is formed so as to have openings on the regions where isolating regions are to be formed and cover active regions where elements are to be formed. After formation of the above-mentioned resist, etching is performed while the resist is used as a mask, whereby an isolating trench for partitioning an active region is formed.

After the formation of the isolating trench, silicon dioxide ($SiO_2$) is deposited on the silicon substrate 10 through use of a chemical vapor deposition (CVD) method, as illustrated in FIGS. 16A and 16B. As a result, the isolating trench is filled by a $SiO_2$ film 14. Then, CMP is performed to remove the protruding portion of the $SiO_2$ film 14. During the CMP process, the SiN film 13 serves as a stopper film. As a result, $SiO_2$ remains only within the isolating trench, as illustrated in FIGS. 17A and 17B.

Next, as illustrated in FIGS. 18A and 18B, the SiN film 13 is removed through use of a phosphoric acid heated to a predetermined temperature. Finally, as illustrated in FIGS. 19A and 19B, the $SiO_2$ layer 12 is removed through use of a fluoric acid. The aforementioned steps results in a formation of a trench-shaped isolating region.

In the former trench isolation method, CMP for polishing the protruding portion of the $SiO_2$ film 14 is performed by employing slurry containing $SiO_2$. However, the polishing selectivity ratio of a $SiO_2$ film and a SiN film implemented by the slurry containing $SiO_2$ is about 3:1. To polish efficiently only the $SiO_2$ film 14 by the CMP so as to ensure a desirable polished quality, it is advantageous that the above-mentioned selectivity ratio has a greater value. It is also desirable that the above-mentioned selectivity ratio have a great value in order to favorably flatten the surface of the silicon substrate 10 by execution of the CMP.

To manufacturing semiconductor ICs having stable quality at a high yield, it is important to fabricate isolating regions efficiently and accurately. Further, to fabricate isolating regions efficiently and accurately, it is important to ensure a desired polished quality stably by CMP as well as to ensure a favorable flatness by CMP. For these points, in the former trench isolation method, there is yet room for improvement which enhances a yield of semiconductor ICs having stable quality.

SUMMARY OF THE INVENTION

The present invention has been conceived to solve the previously-mentioned problems, and a general object of the present invention is to provide a novel and useful method of manufacturing a semiconductor device.

A more specific object of the present invention is to provide a manufacturing method for semiconductor devices in which CMP is executed under a condition suitable to ensures a desired polished quality and a favorable flatness, thereby enabling a high yield manufacturing of semiconductor devices having stable characteristics.

The above object of the present invention is achieved by a method of manufacturing a semiconductor device including the steps below. The method includes a step for forming a silicon nitride film on a semiconductor substrate. The silicon nitride film serves as a polishing stopper film The method also includes a step for etching the silicon nitride film and the semiconductor substrate in a region to form an isolating trench which partitions an active region. The method further includes a step for depositing a silicon oxide film on the semiconductor substrate so that the isolating trench is filled with the silicon oxide film and a surface level difference is formed thereon. The single silicon oxide film is polished to reduce the surface level difference, by employing a first slurry suitable for polishing a silicon oxide film and also suitable for reducing the surface level difference or reducing a slope of the surface level difference. The silicon oxide film is further polished until the silicon nitride film is exposed, by employing a second slurry which contains cerium dioxide, after the surface level difference has been reduced.

The above object of the present invention is achieved by a method of manufacturing a semiconductor device including the steps below. The method includes a step for forming a silicon nitride film on a semiconductor substrate. The silicon nitride film serves as a polishing stopper film. The method also includes a step for etching the silicon nitride film and the semiconductor substrate in a region to form an isolating trench which partitions an active region. The method further includes a step for depositing a silicon oxide film on the semiconductor substrate so that the isolating trench is filled with the silicon oxide film and a surface level difference is formed thereon. A surface depression in the silicon oxide film is filled with a flattening material to reduce the surface level difference. The silicon oxide film is polished until the silicon nitride film is exposed, by employing a slurry which contains cerium dioxide, after the surface level difference has been reduced.

The above object of the present invention is achieved by a method of manufacturing a semiconductor device including the steps below. The method includes a step for forming a silicon nitride film on a semiconductor substrate. The silicon nitride film serves as a polishing stopper film. The method also includes a step for etching the silicon nitride film and the semiconductor substrate in a region to form an isolating trench which partitions an active region. The method further includes a step for depositing a silicon oxide film on the semiconductor substrate so that the isolating trench is filled with the silicon oxide film and a surface level difference is formed thereon. Wet chemical etching is performed on a surface of the silicon oxide film to reduce surface level difference in the surface of the silicon oxide film. The silicon oxide film is polished until the silicon nitride film is exposed, by employing a slurry which contains cerium dioxide, after the surface level difference has been reduced.

The above object of the present invention is achieved by a method of manufacturing a semiconductor device including the steps below. The method includes a step for forming a pattern element on a semiconductor substrate or an interlayer insulating film. The method also includes a step for depositing a silicon oxide film on the semiconductor substrate so that the pattern element is covered therewith and a surface level difference is formed thereon. The method further includes a step for polishing the silicon oxide film to reduce the surface level difference, by employing a first slurry suitable for polishing a silicon oxide film and also suitable for reducing the surface level difference or reducing a slope of the surface level difference. The silicon oxide film is polished, by employing a second slurry which contains cerium dioxide, after the surface level difference has been reduced.

The above object of the present invention is also achieved by a method of manufacturing a semiconductor device including the steps below. The method includes a step for forming a pattern element on a semiconductor substrate or an interlayer insulating film. The method also includes a step for depositing a silicon oxide film on the semiconductor substrate so that the pattern element is covered therewith and a surface level difference is formed thereon. The method further includes a step for filling a surface depression in the silicon oxide film with a flattening material to reduce the surface level difference. The silicon oxide film is polished, by employing a slurry which contains cerium dioxide, after the surface level difference has been reduced.

The above object of the present invention is further achieved by a method of manufacturing a semiconductor device including the steps below. The method includes a step for forming a pattern element on a semiconductor substrate or an interlayer insulating film. The method also includes a step for depositing a silicon oxide film on the semiconductor substrate so that the pattern element is covered therewith and a surface level difference is formed thereon. The method further includes a step for performing wet chemical etching on a surface of the silicon oxide film to reduce the surface level difference. The silicon oxide film is polished, by employing a slurry which contains cerium dioxide, after the surface level difference has been reduced.

Other objects and further features of the present invention will be apparent from the following detailed description when read in conjunction with the accompanying drawings.

BRIEF DESCRIPTION OF THE DRAWINGS

FIGS. 3A through 8B are sectional views for explaining a manufacturing method of a semiconductor device practiced as a second embodiment of the present invention;

FIGS. 9A through 14B are sectional views for explaining a manufacturing method of a semiconductor device practiced as a third embodiment of the present invention;

FIGS. 15A through 19B are sectional views for explaining a former manufacturing method of a semiconductor device.

DESCRIPTION OF THE PREFERRED EMBODIMENTS

Figure 1:
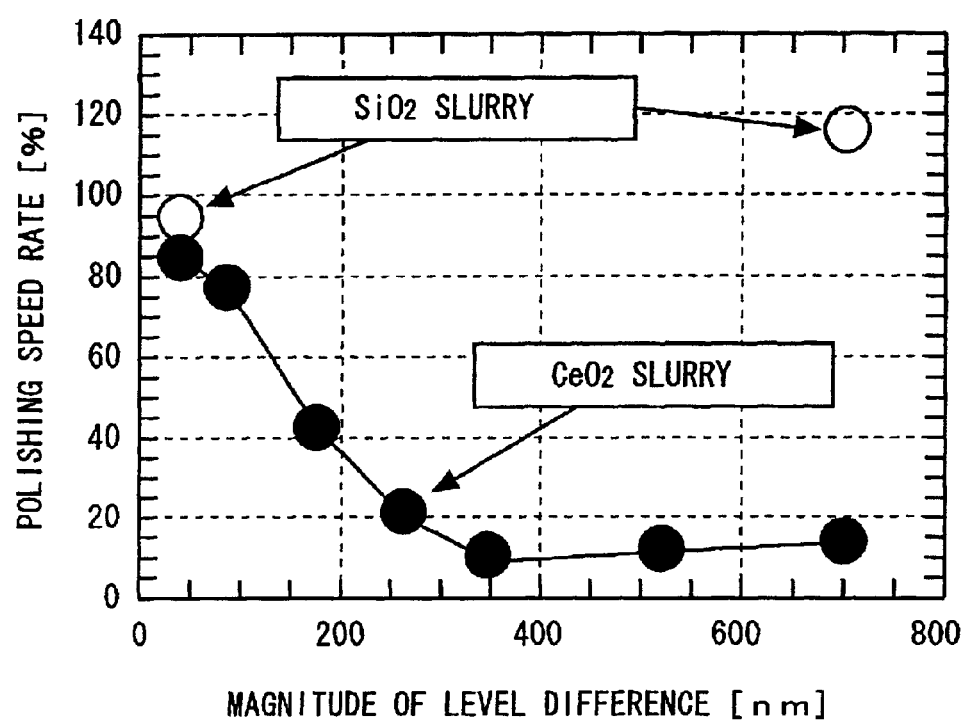
FIG. 1 is a plot showing characteristics of a first slurry and a second slurry both employed in a manufacturing method of a semiconductor devise practiced as a first embodiment of the present invention.

In the following, principles and embodiments of the present invention will be described with reference to the accompanying drawings. Throughout the drawings, like reference numerals designate like or corresponding parts, and descriptions of such parts are omitted where they are repetitive.

First Embodiment

FIG. 1 shows the characteristics of two kinds of slurries employed in a manufacturing method for semiconductor devices practiced as a first embodiment of the present invention. As described later, in the first embodiment, both first-stage CMP which employs a first slurry containing $SiO_2$ and second-stage CMP which employs a second slurry containing cerium dioxide ($CeO_2$) are executed to polish a silicon oxide film deposited on a silicon substrate during formation process of an isolating region on the silicon substrate. The results denoted by ○ in FIG. 1 indicate the characteristic of the first slurry containing $SiO_2$, while the results shown by ● indicate the characteristic of the second slurry containing $CeO_2$.

In FIG. 1 the horizontal axis represents the magnitude of level difference in the silicon wafer surface to be polished, while the vertical axis represents a ratio of an polishing speed of an inspection object (i.e., a silicon wafer with level difference in its surface) and that of a silicon wafer with a flat surface. More specifically, the vertical axis represents a ratio of polishing speed of a protruding portion on the inspection object and that of the flat silicon wafer. As shown in FIG. 1, the first slurry containing $SiO_2$ ensures a polishing speed ratio exceeding 100% when there is a large level difference in the silicon wafer surface. Thus, CMP employing the first slurry enables an efficient polishing of the silicon substrate regardless of the level difference thereof.

Figure 2A:
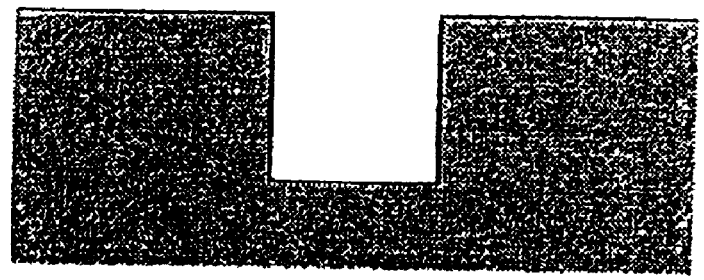
FIGS. 2A through 2C are sectional views showing figures of level differences which are taken into account in the first embodiment.
Figure 2B:
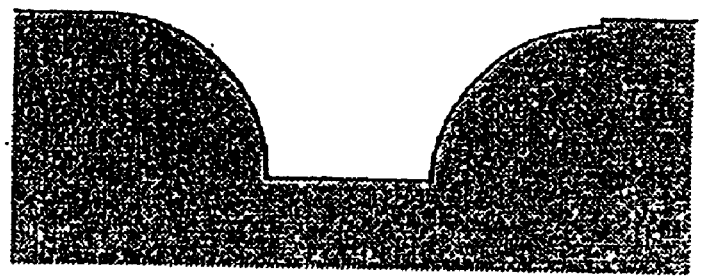
Figure 2C:
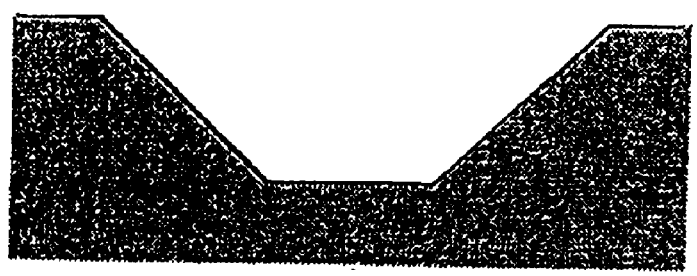

On the other hand, the second slurry containing $CeO_2$, as shown in FIG. 1, has a characteristic that reduces the polishing speed ratio as level difference in a silicon wafer surface becomes larger. Particularly, the polishing speed ratio implemented by CMP employing the second slurry reduces to a significantly smaller value when the magnitude of level difference exceeds 400 nm. For this reason, when level difference exceeding 400 nm is present in the surface of a silicon substrate, the substrate surface cannot be efficiently polished by CMP employing the second slurry. Although the experimental results shown in FIG. 1 have been obtained for the case where level difference includes a vertical wall as shown in FIG. 2A (such level difference will hereinafter be referred to as a "vertical level difference"), similar results are also obtained for the case where level difference includes a curved wall as shown in FIG. 2B (such level difference will hereinafter be referred to as a "curved level difference") and the case where level difference includes a inclined wall as shown in FIG. 2C (such level difference will hereinafter be referred to as a "inclined level difference").

According to the CMP that is executed with the first slurry containing $SiO_2$, the $SiO_2$ film and the SiN film are polished with a selectivity ratio of about 3:1. On the other hand, according to the CMP that is executed with the second slurry containing $CeO_2$, the $SiO_2$ film and the SiN film can be polished with a large selectivity ratio of about 50:1. For this reason, if the $SiO_2$ film and the SiN film are polished with the second slurry, the SiN film effectively serves as a stopper film of the CMP.

The first slurry containing $SiO_2$ is superior to the second slurry containing $CeO_2$ in the point where enabling efficient polishing of the silicon substrate surface regardless of level difference thereof. The second slurry, on the other hand, is superior to the first slurry by the fact that being capable of polishing of the $SiO_2$ film and the SiN film with a large selectivity ratio. The manufacturing method according to the first embodiment has a feature in that effectively utilizing the advantages of the two slurries during a formation process of isolating regions.

Now, the description will be given of the manufacturing method practiced as the first embodiment of the present invention with reference to FIGS. 3A through 8B. FIGS. 3A, 4A, 5A, 6A, 7A and 8A are sectional views showing a section where two isolating regions are provided adjacently to each other, whereas FIGS. 3B, 4B, 5B, 6B, 7B and 8B are sectional views showing a section where a relatively large active region is formed near an isolating region.

Figures 3A, 3B:
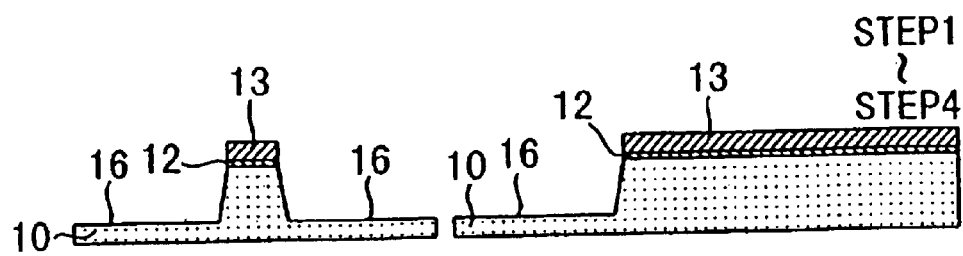

FIGS. 3A and 3B illustrate the states in which an isolating trench 16 has been formed in a silicon substrate 10, respectively. The isolating trench 16 is formed by carrying out the following steps:

(Step 1) A $SiO_2$ film 12 of about 10 to 50 nm thick is formed on the silicon substrate 10 by thermal oxidation.

(Step 2) A SiN film 13 with a film thickness of about 50 to 300 nm is formed on the $SiO_2$ film 12.

(Step 3) A resist mask (not shown) having openings in regions corresponding to the isolating trench 16 is formed on the SiN film 13 by a photo-lithographic process.

(Step 4) The SiN film 13 and the $SiO_2$ 12 are removed from the unmasked portion corresponding to the isolating trench 16 by anisotropic etching. Furthermore, the silicon substrate 10 is removed by a depth of about 100 to 500 nm, whereby the isolating trench 16 is formed.

Figures 4A, 4B:
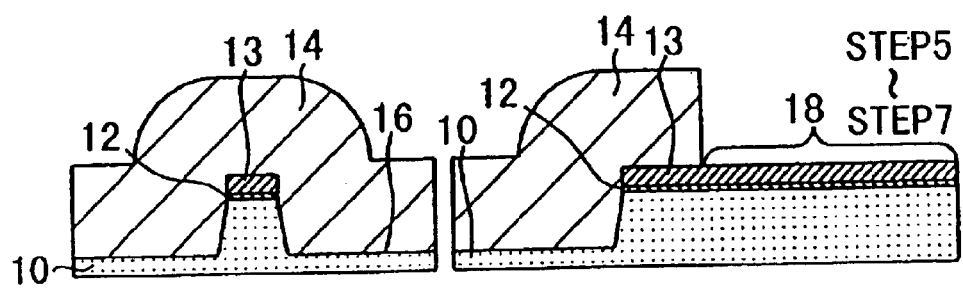

FIGS. 4A and 4B illustrate the states in which a $SiO_2$ film 14 has been deposited on the silicon substrate 10, respectively. The states illustrated in FIGS. 4A and 4B are formed by carrying out the following steps after the formation of the isolating trench 16.

(Step 5) The $SiO_2$ film 14 is deposited on the silicon substrate 10 through use of the CVD method. In this step 5 the $SiO_2$ film 14 is deposited so that its film thickness is equal to or greater than the total value of the depth of the isolating trench 16, the film thickness of the $SiO_2$ film 12, and the film thickness of the SiN film 13. Although the $SiO_2$ film 14 is deposited by the CVD method in this embodiment, it may be deposited by a high-density plasma chemical vapor deposition (HDP-CVD) method.

(Step 6) A resist mask (not shown), which has openings in regions 18 on which elements are fabricated (hereinafter referred to as "active regions 18"), is formed on the $SiO_2$ film 14 by a photo-lithographic process.

(Step 7) The parts of the $SiO_2$ film 14 deposited on the active regions 18 are removed by dry etching.

Figures 5A, 5B:
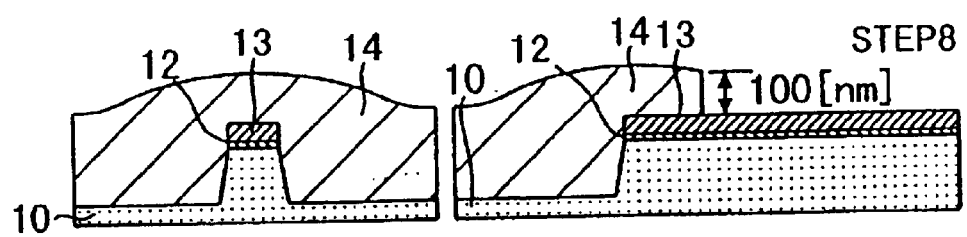

FIGS. 5A and 5B illustrate the states formed by execution of the first-stage CMP, respectively. The states illustrated in FIGS. 5A and 5B are provided by carrying out the following step after the dry etching of the $SiO_2$ film 14.

(Step 8) The first-stage CMP is performed until the depth of the vertical level difference in the $SiO_2$ layer 14 reaches about 100 nm, by employing the first slurry containing $SiO_2$. The first-stage CMP is one of the characteristic steps of the manufacturing method according to the first embodiment. In this embodiment, for the sake of the simplification of quality control, the ending time of the first-stage CMP is controlled based on the elapsing time from the starting time thereof.

According to the manufacturing method of this embodiment, as described above, the parts of the $SiO_2$ film 14 on the active regions 18 are removed by dry etching before the polishing of the $SiO_2$ film 14 by the first-stage CMP. According to dry etching, the parts of the $SiO_2$ film 14 deposited on relatively wide regions can be efficiently removed compared with CMP. For this reason, the first embodiment enable to remove the $SiO_2$ film 14 more efficiently compared with a method in which the $SiO_2$ film 14 on the entire region is removed by CMP.

The dry etching for removing the $SiO_2$ film 14 on the active region 18 results in a formation of a large vertical level difference in the boundary portion between the active region 18 and the non-active region (see FIG. 4B). As mentioned above, the first slurry enables efficiently polishing of an object even when a large vertical level difference is formed in the object (see FIG. 1). For this reason, the aforementioned manufacturing method can efficiently reduce the large vertical level difference formed in the surface of the silicon substrate 10.

In the first embodiment, the first-stage CMP is carried out in the state in which the $SiO_2$ film 14 is exposed. That is, in this embodiment, the first-stage CMP is implemented for the purpose of efficiently polishing the single layer of the $SiO_2$ film 14. For this reason, the characteristic of the first slurry is set primary from the viewpoint that silicon dioxide ($SiO_2$) can be efficiently polished.

For instance, in the case where the first-stage CMP is implemented under the situation in which another film is overlaid on the $SiO_2$ film 14, there will arise a need to consider the suitability of the first slurry with the overlying film in setting process of the characteristic of the first slurry.

Similarly, in the case where polishing is required of another layer formed underneath the $SiO_2$ film 14, there will also arise a need to consider the suitability of the first slurry with the underlying film. On the other hand, in this embodiment the characteristic of the first slurry can be determined only by taking the suitability with silicon dioxide ($SiO_2$) into consideration. In this regard, the manufacturing method according to the first embodiment has an advantageous characteristic for polishing the $SiO_2$ film 14 efficiently by the first-stage CMP.

Figures 6A, 6B:
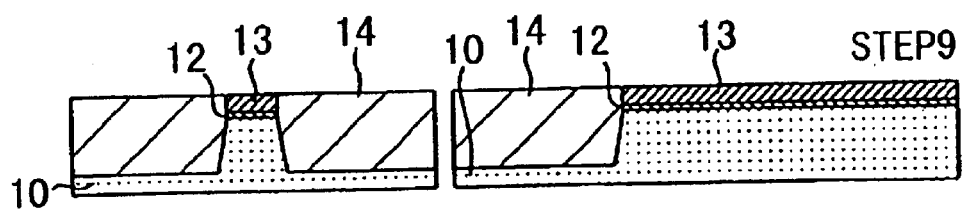

FIGS. 6A and 6B illustrate the states provided by execution of the second-stage CMP, respectively. The states illustrated in FIGS. 6A and 6B are formed by carrying out the following step after the execution of the first-stage CMP.

(Step 9) The $SiO_2$ layer 14 is polished until the SiN film 13 is exposed, by the second-stage CMP which employs the second polishing agent containing $CeO_2$. The second-stage CMP is one of the characteristic steps of the manufacturing method according to the first embodiment. In this embodiment, the end time of the second-stage CMP is controlled, as the case of the first-stage CMP, based on the elapse time from the start time of the CMP for the sake of simplification of control.

As mentioned above, in the first embodiment, the second-stage CMP is executed at the stage in which the depth of the vertical level difference in the surface of the $SiO_2$ film 14 has been suitably reduced. The second slurry employed in the second-stage CMP is a polishing agent which is capable of efficiently polishing an object having a small level difference and also polishing $SiO_2$ and SiN with a high selectivity ratio. For this reason, according to the second-stage CMP, the $SiO_2$ film 14 can be efficiently removed while the SiN film 13 is serving as an effective stopper film.

In the CMP having the object of removing the $SiO_2$ film 14, if the SiN film 13 effectively serves as a stopper film, the SiN film 13 with a large film thickness is apt to be left behind when the CMP ends. Therefore, a according to the aforementioned CMP, a desirable polished state can be obtained easily and stably without being affected by fluctuation in processing conditions. In addition, in the situation in which the SiN film 13 efficiently serves as a stopper film, the flatness degree of e SiN film 13 is apt to be kept at a great value during execution of the CMP, while the s face height of the $SiO_2$ film 14 and that of the SiN film 13 are apt to be equal. As a result, a superior flatness degree is imparted to the surface of the $SiO_2$ film 14. Furthermore, according to the CMP employing $CeO_2$, scratches in the wafer caused by polishing can be reduced to a small amount in comparison with the CMP employing $SiO_2$. Therefore, the manufacturing method according to the first embodiment is also effective for an enhancement in the polished quality of the wafer.

As mentioned above, the first embodiment which performs the first-stage CMP and the second-stage CMP reliably enables the $SiO_2$ film 14 formed in the isolating trench 16 to be of a superior flatness without being affected by fluctuation in processing conditions. For this reason, according to the manufacturing method practiced as the first embodiment, semiconductor devices with stable isolating regions can be manufactured at a high yield.

Figures 7A, 7B:
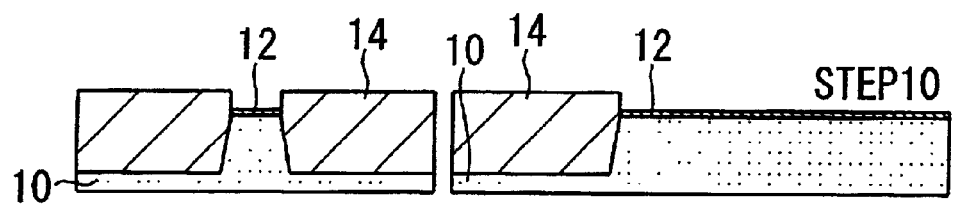
Figures 8A, 8B:
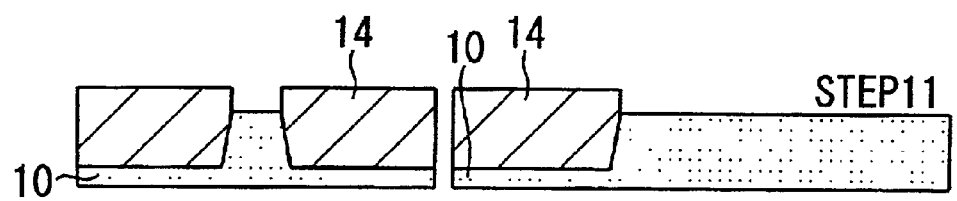

After the completion of the second-stage CMP, as shown in FIGS. 7A and 7B, the SiN film 13 is removed by wet etching which employs a heated phosphoric acid (step 10). Then, as shown in FIGS. 8A and 8B, the $SiO_2$ film 12 is removed by wet etching which employs a fluoric acid (step 11). The aforementioned steps form a trench-shaped isolating regions which partition the active regions 18.

In the first embodiment, the first-stage CMP and the second-stage CMP are performed sequentially while slurries are switched on the same table (hereinafter referred to as a "CMP table"). According to such a technique, the first-stage CMP and the second-stage CMP are performed with a high throughput.

Further, during the manufacturing process, cleaning water for washing out the first slurry are supplied to the CMP table after completion of the first-stage CMP. Then, the second slurry is supplied to the CMP table after the first slurry has been washed out of the silicon substrate. For this reason, although the first-stage CMP and the second-stage CMP are performed on the same table, mixture of the slurries are prevented from arising.

Furthermore, in the CMP table, after the completion of the first-stage CMP, a dressing process of a polishing cloth, that is, the process of polishing the surface of a polishing cloth with a diamond abrasive grain, is executed. According to the above-mentioned dressing process, the state of the polishing cloth can be restored to a state which can exhibit initial performance, and at the same time, the first slurry can be removed from the surface of the polishing cloth. For this reason, according the first embodiment, the first and second slurries can be strictly prevented from mixing with each other, and also the silicon substrate 10 can be efficiently polished during the second-stage CMP.

In the aforementioned embodiment, although the first-stage CMP and the second-stage CMP are performed sequentially on the same table, the present invention is not limited to the embodiment. For example, the second-stage CMP may be newly executed after cleaning and drying of the silicon substrate, which are performed after the completion of the first-stage CMP.

In the aforementioned embodiment, the washing water and the dressing process are employed, when the first-stage CMP and the second-stage CMP are executed sequentially on the same table, for preventing the first and second slurries from being mixed. However, the present invention is not limited to the embodiment. That is, in the case where the mixture of the first and second slurries arises no problem, the washing and dressing processes may be omitted.

In the aforementioned embodiment, although the vertical level difference in the $SiO_2$ film 14 is reduced to about 100 nm by means of the first-stage CMP, the present invention is not limited to the embodiment. As shown in FIG. 1, the second slurry containing $CeO_2$ exhibits a superior polishing ability in a region where the vertical level difference is equal to or less than 400 nm. For this reason, the $SiO_2$ film 14 may be polished so that the vertical level difference is reduced to less than about 400 nm by the first-stage CMP.

In the aforementioned embodiment, although the $SiO_2$ film 14 on the active region 18 is removed by etching prior to the first-stage CMP, the present invention is not limited to the embodiment. For example, after the $SiO_2$ film 14 has been deposited on the silicon substrate 10, the $SiO_2$ film 14 may be polished by the first-stage CMP without performing etching.

In the aforementioned embodiment, while a slurry containing $SiO_2$ is employed as the first-slurry, the first slurry is not limited to this. The first slurry may be any slurry which is capable of efficiently polishing the $SiO_2$ film 14 regardless of the level difference in an object to be polished. A slurry containing $Al_2O_3$, $ZrO_2$, $Mn_2O_3$, or $MnO_2$, illustratively, may be employed as the first slurry.

In the aforementioned embodiment, the first-stage CMP is executed for reducing the vertical level difference in the $SiO_2$ film 14, the purpose of the first-stage CMP is not limited to this. That is, the CMP employing the first slurry containing $SiO_2$ enables the vertical level difference in the SiO₂ film 14 to be reduced as well as the corner of the level difference to be gentle. The polishing rate of the CMP employing the second slurry containing CeO₂ increases as the surface level difference in the SiO₂ film 14 becomes smaller as well as the surface level difference becomes gentle. For this reason, according to the present invention, the second-stage CMP can be efficiently performed due to both of these advantageous effects.

In the aforementioned embodiment, although the level difference, which is reduced or to be gentle by the first-stage CMP, is limited to a vertical level difference, the present invention is not limited to the embodiment. For example, a curved level difference including curved walls which connect convex portions and concave portions is formed in the surface of the SiO₂ film formed by the CVD method. Also, an inclined level difference including inclined walls which connect convex portions and concave portions is formed in the surface of the SiO₂ film formed by the HDP-CVD method. The first-stage CMP also enables these level differences to be reduced and gentle. Accordingly, even in the case a curved level difference or an inclined level difference is formed in the surface of the SiO₂ film, the manufacturing method practiced as the first embodiment enables the surface to be flattened.

Second Embodiment

A description will be given of a manufacturing method for semiconductor devices according to a second embodiment of the present invention in reference to FIGS. 9A through 14B.

Figures 9A, 9B:
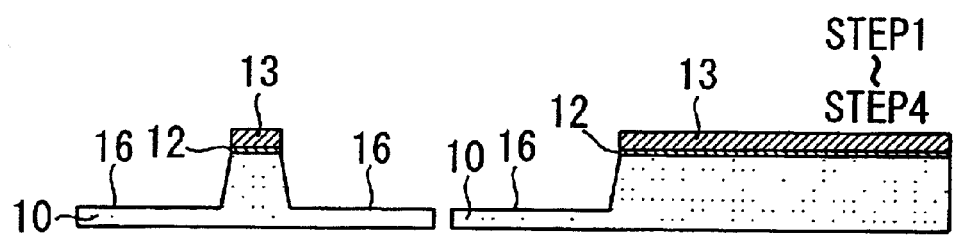
Figures 10A, 10B:
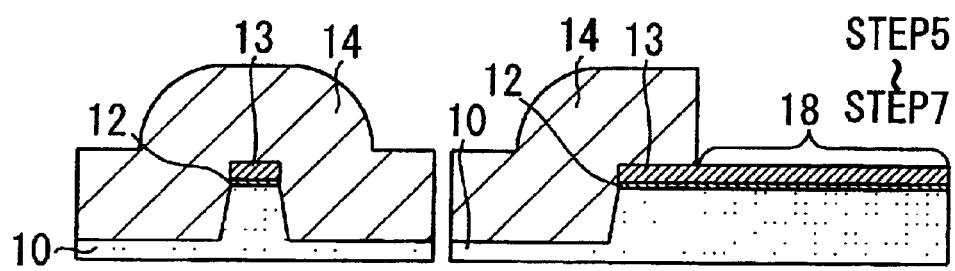

In the manufacturing method according to the second embodiment, as the case of the first embodiment, an isolating trench 16 is formed through execution of steps 1 to 4 (see FIGS. 9A and 9B). Furthermore, in the manufacturing method according to the second embodiment, like the case of the first embodiment, a SiO₂ film 14 with a vertical level difference is formed by executing steps 5 through 7 (see FIGS. 10A and 10B).

The manufacturing method practiced as the second embodiment has a first characteristic in the fact that a vertical level difference in the surface of the SiO₂ film 14 is reduced by filling a flattening material into concave portions of the surface after the SiO₂ film 14 has been formed by the aforementioned steps. Further, the manufacturing method practiced as the second embodiment has a second characteristic in the fact that the CMP employing a slurry containing CeO₂ is performed after the vertical level difference in the SiO₂ film 14 has been reduced by the aforementioned technique. Even in the second embodiment, for the sake of convenience, a polishing agent containing CeO₂ is referred to as a second slurry and CMP employing that slurry is referred to as second-stage CMP.

Figures 11A, 11B:
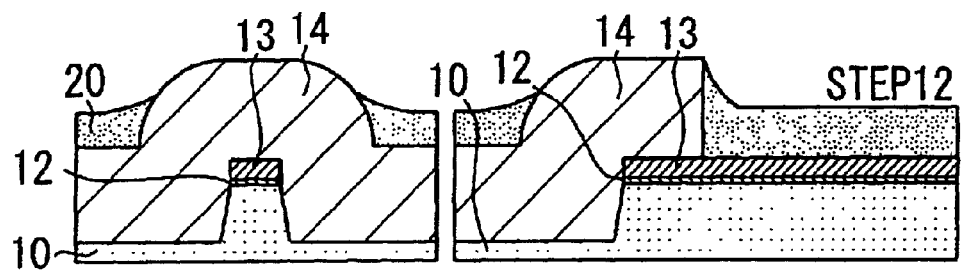

FIGS. 11A and 11B illustrate the states in which a silicon substrate 10 has been coated with a flattening material, respectively. The states illustrated in FIGS. 11A and 11B are obtained by carrying out the following step after removable of the SiO₂ film 14 from an active region 18.

(Step 12) The surface of the silicon substrate 10 is coated with spin-on glass (SOG) 20. The SOG is deposited in a depression portion in the SiO₂ film 14. As a result, through execution of this step, a vertical level difference formed in the surface in the SiO₂ film 14 becomes gentle. When an object to be polished has a gentle vertical level difference, the surface of the object can be efficiently polished by the second-stage CMP employing the second slurry. Therefore, execution of step 12 provides the state required to efficiently perform the second-stage CMP, as the first-stage CMP in the first embodiment does.

Figures 12A, 12B:
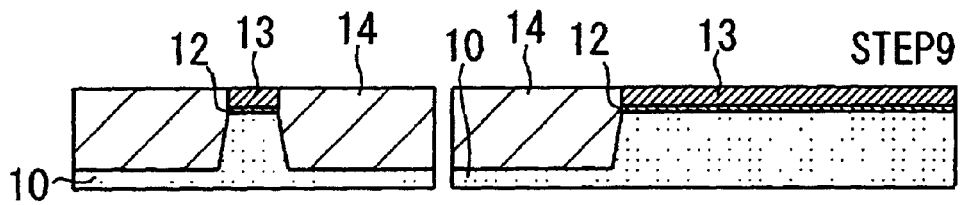
Figures 13A, 13B:
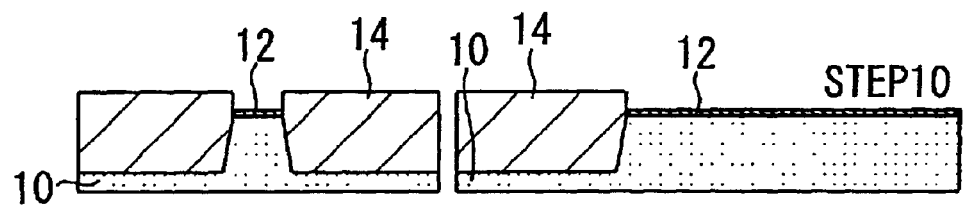
Figures 14A, 14B:
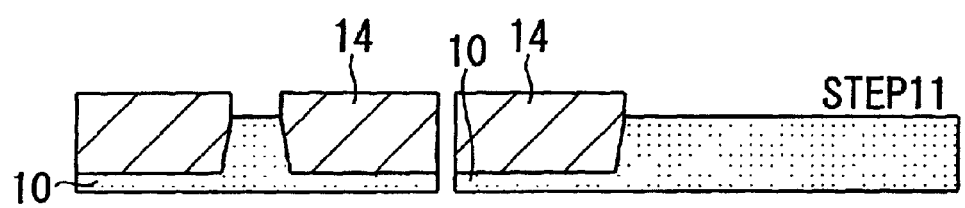
Figures 15A, 15B:
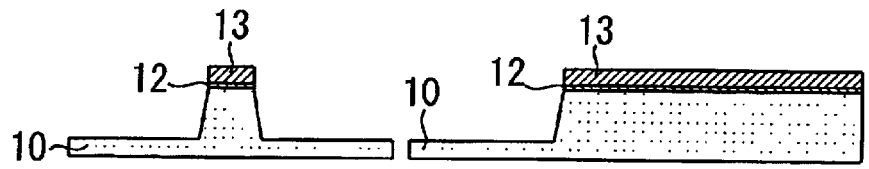
Figures 16A, 16B:
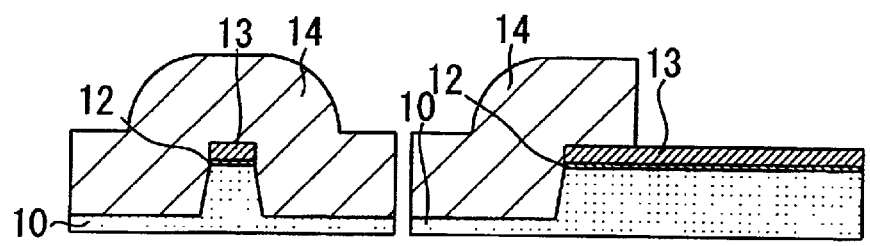
Figures 17A, 17B:
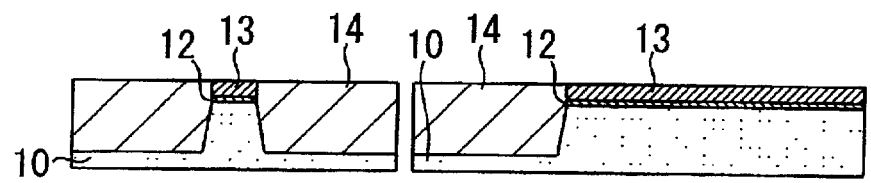
Figures 18A, 18B:
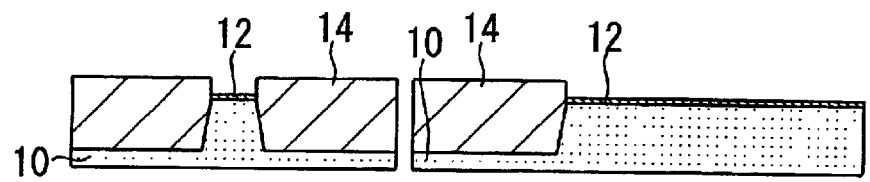
Figures 19A, 19B:
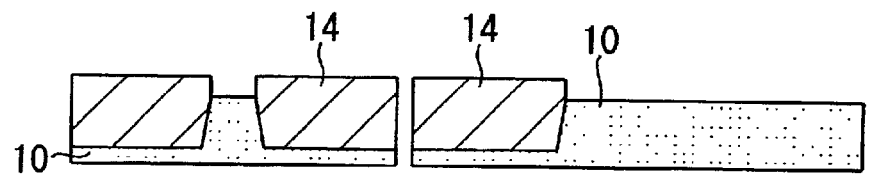

After the completion of step 12, step 9, i.e., the second-stage CMP, is executed as in the case of the first embodiment, whereby the SiO₂ film 14 is polished until the SiN film 13 is exposed (see FIGS. 12A and 12B). Then, the SiN film 13 is removed by step 10 (see FIGS. 13A and 13B). Next, the SiO₂ film 12 is removed by step 11, whereby isolating regions 14 are formed in the substrate 10 (see FIGS. 14A and 14B).

According to the second embodiment, as with the case of the first embodiment, the SiO₂ film 14 can be efficiently polished by the second-stage CMP and also the SiN film 13 can be made to serve as a stopper film effectively during execution of the second-stage CMP. For this reason, according to the fabrication method of the second embodiment, as with the case of the first embodiment, (1) a desirable polished state can be obtained easily and stably without being affectedly fluctuation in the processing conditions, (2) the surface of the SiO₂ film 14 can be imparted with a superior degree of flatness, and (3) polished quality of the wafer can be enhanced.

In the second embodiment, while the SOG 20 is employed as a flattening material for reducing the vertical level difference in the SiO₂ film 14, the present invention is not limited to the SOG 20. For example, the vertical level difference in the SiO₂ film 14 may be reduced by using a BPSG as the flattening material and performing a reflow process after formation of a BPSG film.

Third Embodiment

Hereinafter, a description will be given of a manufacturing method for semiconductor devices according to a third embodiment of the present invention.

As previously described, in the manufacturing method according to the first embodiment, the first-stage CMP (step 8) is executed to reduce the vertical level difference in the SiO₂ film 14. On the other hand, in the manufacturing method according to the second embodiment, the process of filling depression portions of the SiO₂ film 14 with a flattening material (step 12) is performed to reduce the vertical level difference. The manufacturing method according to the third embodiment has a characteristic in the fact that instead of these processes, wet chemical etching is carried out on the entire surface of the silicon substrate 10.

That is, according to the third embodiment, the SiO₂ film 14 having a vertical level difference in the surface thereof is formed by steps 1 through 7. Then, wet chemical etching is performed on the entire surface of the silicon substrate 10. Wet chemical etching has a characteristic of removing a protruding portion in preference to a flat portion. For this reason, the wet chemical etching enables the vertical level difference in the SiO₂ film 14 formed on the silicon substrate 10 to be gentle.

As described above, if the vertical level difference becomes gentle, the surface of an object to be polished can be efficiently polished by the second-stage CMP. Accordingly, the advantageous effects yielded in the first and second embodiments can be obtained even by the manufacturing method according to the third embodiment.

In the third embodiment, although wet chemical etching is performed over the entire surface of the silicon substrate 10, the present invention is not limited to this. That is, wet chemical etching may be performed only on the region excluding the portion according to the isolating trench 16. So long as a region subjected to the wet chemical etching is limited as described above, reduction of the SiO₂ film 14 within the isolating trench 16 will be prevented from arising, whereby a surface depression in the isolating region can be effectively prevented from occurring.

In the first to the third embodiments mentioned above, although one of the CMP employing the first slurry, the process of filling a surface depression with a flattening material, and the wet chemical etching is carried out to reduce the vertical level difference in the $SiO_2$ film 14, the present invention is not limited to those embodiments. For example, a combination of two or more of these processes may be executed to reduce the vertical level difference in the $SiO_2$ film 14.

Fourth Embodiment

A description will be given of a manufacturing method for semiconductor devices according to a fourth embodiment of the present invention in reference to FIGS. 20 through 22.

Figure 20:
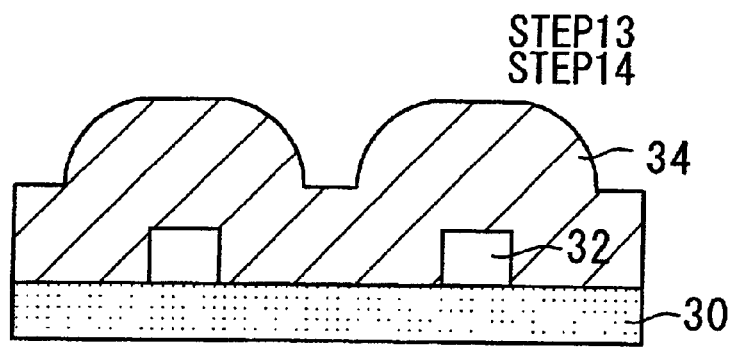
FIGS. 20 through 22 are sectional views for explaining a manufacturing method of a semiconductor device practiced as a forth embodiment of the present invention.
Figure 21:
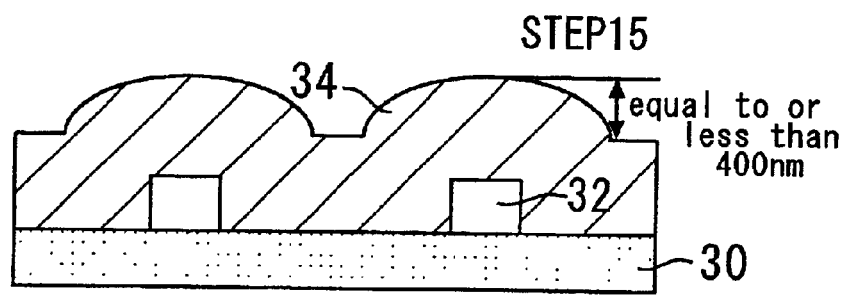
Figure 22:
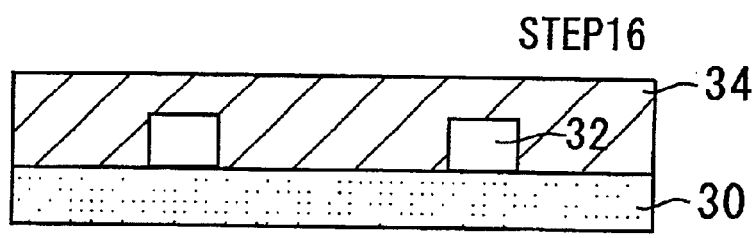

In FIGS. 20 through 22, reference numeral 30 designates a silicon substrate or an interlayer insulating film (called simply "silicon substrate" hereafter). Reference numeral 32 designates a pattern element such as a wiring pattern or a gate. Reference numeral 34 designates an interlayer film formed of $SiO_2$.

As shown in FIG. 20, in the manufacturing method according to the fourth embodiment, the pattern elements 32 are formed on the silicon substrate 30 (step 13). The interlayer insulating film 34 is formed on the silicon substrate 30 so as to cover the pattern elements 32 (step 14). As a result, a surface level difference is formed on the interlayer insulating film due to the presence of the pattern elements 32 underlying thereof.

In the manufacturing method according to the fourth embodiment, first-stage CMP is then executed as shown in FIG. 21 (step 15). The first-stage CMP is performed employing a first slurry containing $SiO_2$ as same as the case of the first embodiment so that the surface level difference of the interlayer insulating film becomes equal to or less than 400 nm.

As stated above, the first slurry is suitable for efficiently polishing an object which has a large surface level difference thereon. Thus, according to the first-stage CMP the large surface level difference on the interlayer insulating film can be efficiently reduced.

In the manufacturing method according to the fourth embodiment, a second-stage CMP is then executed as shown in FIG. 22 (step 16). The second-stage CMP is performed employing a second slurry containing $CeO_2$ as same as the case of the first embodiment. As explained with reference to FIG. 1, the second slurry shows a high polishing effectiveness when a surface level difference of an object to be polished is equal to or less than 400 nm. Further, the second slurry is superior to the first slurry for flattening an object to be polished. Thus, according to the second-stage CMP, it can be possible to flatten the surface of the interlayer insulating film 34 in a high accuracy while efficiently polishing the same by employing the second slurry.

As described above, according to the fourth embodiment, the surface of the interlayer insulating film 34 formed so as to cover pattern elements can be effectively flattened during a semiconductor fabricating process.

Figure 23:
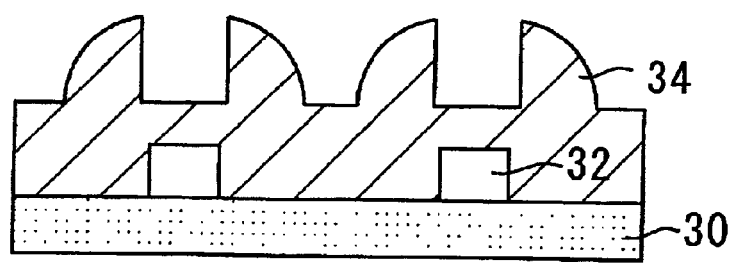
FIG. 23 is a sectional view for explaining a variation of the fourth embodiment.

In the forth embodiment described above, the first-stage CMP is executed immediately after deposition of the interlayer insulating film 34. However, execution timing of the first-stage CMP is not limited to such a timing. As shown in FIG. 23, the first-stage CMP may be executed after removing a certain portion of a protruding portion of the interlayer insulating film 34 by means of etching.

As described above, the second-stage CMP is started after the surface level difference of the interlayer insulating film 34 is reduced to equal to or less than 400 nm. The "400 nm" described above is a boundary value which is determined as a upper limitation defining a region in which effective CMP can be performed employing the second slurry based on the second slurry's feature shown in FIG. 1. The feature shows that the polishing effectiveness of the second slurry is improved as the surface level difference is reduced. Accordingly, the boundary value "400 nm" defining an execution condition of the second-stage CMP may be changed illustratively to "200 nm" or "100 nm" when higher effectiveness is required to CMP process.

In the fourth embodiment described above, a way to reduce a large surface level difference of the interlayer film 34 is limited to the first-stage CMP employing the first slurry, as the first embodiment. However, the way to reduce the surface level difference of the interlayer film 34 is not limited to such a way. The surface level difference may be reduced by employing a flattening material such as SOG or BPSG as the case of the second embodiment. Further, the surface level difference may be reduced by means of a wet etching process as the case of the third embodiment.

The major benefits of the present invention described above are summarized as follows:

According to the first aspect of the present invention, after formation of an isolating trench on a semiconductor substrate, a silicon oxide film is deposited on the semiconductor substrate. As a result, the isolating trench is filled with silicon dioxide. At this time, a protruding portion of the silicon oxide film is formed on the semiconductor substrate at a region away from the isolating trench. In the present invention, the protruding portion of an exposed silicon dioxide film is polished through use of a first slurry. The first slurry is a polishing agent suitable for polishing of the silicon oxide film. For this reason, the exposed silicon oxide film is efficiently polished during the above-mentioned polishing process. Further, the first slurry is also a polishing agent suitable for reducing and smoothening level difference in the silicon oxide film. For this reason, the above-mentioned polishing enables efficiently polishing of protruding portions of the silicon oxide film, thereby efficiently enabling the surface of the semiconductor substrate to be flat. In the present invention, polishing is performed with a second slurry containing $CeO_2$, after level difference in the silicon oxide film has been reduced. The second slurry has a characteristic suitable for efficiently polishing a flat silicon oxide film and also suitable for polishing the silicon oxide film at a large selectivity ratio with respect to the silicon nitride film. For this reason, during the above-mentioned polishing, the silicon oxide film is efficiently polished while the silicon nitride film is effectively serving as a stopper film. Thus, the manufacturing method according to the present invention stably implements a desired polished quality, and imparts a superior flatness degree to a semiconductor.

According to the second aspect of the present invention, the silicon oxide film deposited on an active region can be efficiently removed by etching. The above-mentioned process tends to produce a large level difference in the silicon oxide film at the boundary portion between active region and non-active region. In the present invention, polishing employing a second slurry is performed after the level difference has been reduced by polishing employing a first slurry. For this reason, the present invention efficiently ensures a desirable polished quality.

According to the third aspect of the present invention, the first slurry contains a silicon oxide. According to the slurry containing a silicon oxide, the characteristics required of the first slurry can be satisfied.

According to the fourth aspect of the present invention as set forth in claim 4, the level difference in the silicon oxide film is reduced to less than 400 nm by polishing employing the first slurry. When the level difference is less than 400 nm, the second slurry containing $CeO_2$ efficiently polishes the silicon oxide film. For this reason, the present invention efficiently ensures a desirable polished quality.

According to the fifth aspect of the present invention, the polishing using the first slurry and the polishing employing the second slurry are performed on the same table. For this reason, according to the present invention, the throughput in the polishing step is enhanced, whereby superior productivity can be ensured.

According to the sixth aspect of the present invention, the polishing employing the second slurry can be performed after the surface depression in the silicon oxide film has been filled with a flattening material. For this reason, the present invention efficiently ensures a desirable polished quality while utilizing superior characteristics of the second slurry.

According to the seventh aspect of the present invention, a surface depression in the silicon oxide film is filled with spin-on glass (SOG). That is, the level difference in the silicon oxide film can be easily and reliably reduced with SOG.

According to the eighth aspect of the present invention, a surface depression in the silicon oxide film is filled with BPSG. That is, the level difference in the silicon oxide film can be easily and reliably reduced with BPSG.

According to the ninth aspect of the present invention, the polishing employing the second slurry is performed after wet chemical etching has been performed on the surface of the silicon oxide film. Through use of wet chemical etching, the level difference in the silicon oxide film becomes gentle. So long as the level difference in the silicon oxide film is gentle, a desirable polished quality can be efficiently ensured with the second slurry. For this reason, the present invention efficiently ensures a desirable polished quality by utilizing the superior characteristics of the second slurry.

According to the tenth aspect of the present invention, wet chemical etching is performed over the entire surface of the silicon oxide film, whereby the level difference in the silicon oxide film can be reduced easily and reliably. For this reason, according to the present invention, a desirable polished quality can be ensured with an easy process.

According to the eleventh aspect of the present invention, silicon substrate is subjected to wet chemical etching only at the active regions. The above-mentioned wet chemical etching prevents the silicon oxide film deposited on the isolating trench from being removed. For this reason, the present invention is capable of utilizing the superior characteristics of the second slurry while appropriately ensuring the thickness of the silicon oxide film in the isolating trench.

Further, the present invention is not limited to these embodiments, but variations and modifications may be made without departing from the scope of the present invention.

The entire disclosure of Japanese Patent Application No. Hei 10-240236 filed on Aug. 26, 1998 including specification, claims, drawings and summary are incorporated herein by reference in its entirety.

What is claimed is:

1. A method of manufacturing a semiconductor device, comprising the steps of:
    forming a silicon nitride film a semiconductor substrate, said silicon nitride film serving as a polishing stopper film;
    etching said silicon nitride film and said semiconductor substrate in a region to form an isolating trench which partitions an active region;
    depositing a silicon oxide film on said semiconductor substrate so that said isolating trench is filled with said silicon oxide film and a surface level difference is formed thereon;
    polishing said single silicon oxide film to reduce the surface level difference, by employing a first slurry suitable for polishing a silicon oxide film and also suitable for reducing said surface level difference or reducing a slope of said surface level difference; and
    polishing said silicon oxide film until said silicon nitride film is exposed, by employing a second slurry which contains cerium dioxide, after said surface level difference has been reduced.

2. The method according to claim 1, wherein the polishing of said silicon oxide film with said first slurry and the polishing of said silicon oxide film with said second slurry are executed on the same table.

3. The method according to claim 1, wherein the first slurry is essentially free of cerium dioxide.

4. The method according to claim 1, wherein said surface level difference is reduced to equal to or less than 400 nm in the step of polishing employing said first slurry.

5. The method according to claim 4, wherein the polishing of said silicon oxide film with said first slurry and the polishing of said silicon oxide film with said second slurry are executed on the same table.

6. The method according to claim 1, wherein said first slurry is a polishing agent that contains a silicon oxide.

7. The method according to claim 6, wherein said surface level difference is reduced to equal to or less than 400 nm in the step of polishing employing said first slurry.

8. The method according to claim 6, wherein the polishing of said silicon oxide film with said first slurry and the polishing of said silicon oxide film with said second slurry are executed on the same table.

9. The method according to claim 1, further comprising a step of removing a portion of said silicon oxide film deposited on said active region by etching prior to the polishing of the same.

10. The method according to claim 9, wherein said first slurry is a polishing agent that contains a silicon oxide.

11. The method according to claim 9, wherein said surface level difference is reduced to equal to or less than 400 nm in the step of polishing employing said first slurry.

12. The method according to claim 9, wherein the polishing of said silicon oxide film with said first slurry and the polishing of said silicon oxide film with said second slurry are executed on the same table.

13. A method of manufacturing a semiconductor device, comprising the steps of:
    forming a silicon nitride film on a semiconductor substrate, said silicon nitride film serving as a polishing stopper film;
    etching said silicon nitride film and said semiconductor substrate in a region to form an isolating trench which partitions an active region;
    depositing a silicon oxide film on said semiconductor substrate so that said isolating trench is filled with said silicon oxide film and a surface level difference is formed thereon;
    filling a surface depression in said silicon oxide film with a flattening material to reduce said surface level difference; and
    polishing said silicon oxide film until said silicon nitride film is exposed, by employing a slurry which contains cerium dioxide, after said surface level difference has been reduced.

14. The method according to claim 13, wherein said flattening material is formed by coating said silicon oxide film with spin-on glass.

15. The method according to claim 13, wherein said flattening material is provided by forming a film of BPSG on said silicon oxide film and then performing a reflow process.

16. The method according to claim 13, wherein at least one of steps for polishing said silicon oxide film by employing a first slurry suitable for polishing a silicon oxide film and also suitable for reducing said surface level difference or making said surface level difference gentle; and performing wet chemical etching on a surface of said silicon oxide film is executed in combination with the step of the filling which employs said flattening material.

17. A method of manufacturing a semiconductor device, comprising the steps of:
   forming a silicon nitride film on a semiconductor substrate, said silicon nitride film serving as a polishing stopper film;
   etching said silicon nitride film and said semiconductor substrate in a region to form an isolating trench which partitions an active region;
   depositing a silicon oxide film on said semiconductor substrate so that said isolating trench is filled with said silicon oxide film and a surface level difference is formed thereon;
   performing wet chemical etching on a surface of said silicon oxide film to reduce surface level difference in the surface of said silicon oxide film; and
   polishing said silicon oxide film until said silicon nitride film is exposed, by employing a slurry which contains cerium dioxide, after said surface level difference has been reduced.

18. The method according to claim 17, wherein said wet chemical etching is executed over the entire surface of said silicon oxide film.

19. The method according to claim 17, wherein said wet chemical etching is executed only on said active region while a non-active region is covered with a resist material.

20. The method according to claim 1, wherein at least one of steps for filling a surface depression in said silicon oxide film with a flattening material; and performing wet chemical etching on a surface of said silicon oxide film is executed in combination with the step of the polishing which employs said first slurry.

21. The method according to claim 17, wherein at least one of steps for polishing said silicon oxide film by employing a first slurry suitable for polishing a silicon oxide film and also suitable for reducing said surface level difference or making said surface level difference gentle; and filling a surface depression in said silicon oxide film with a flattening material is executed in combination with the step of the wet chemical etching.

22. A method of manufacturing a semiconductor device, comprising the steps of:
   forming a pattern element on semiconductor substrate or an interlayer insulating film;
   depositing a silicon oxide film on said semiconductor substrate so that said pattern element is covered therewith and a surface level difference is formed thereon;
   polishing said silicon oxide film to reduce the surface level difference to equal or less than 400 nm, by employing a first slurry suitable for polishing a silicon oxide film; and
   polishing said silicon oxide film, by employing a second slurry which contains cerium dioxide, after said surface level difference has been reduced.

23. The method according to claim 22, wherein said first slurry is a polishing agent that contains a silicon oxide.

24. A method of manufacturing a semiconductor device, comprising the steps of:
   forming a pattern element on a semiconductor substrate or an interlayer insulating film;
   depositing a silicon oxide film on said semiconductor substrate so that said pattern element is covered therewith and a surface level difference is formed thereon;
   filling a surface depression in said silicon oxide film with a flattening material to reduce said surface level difference; and
   polishing said silicon oxide film, by employing a slurry which contains cerium dioxide, after said surface level difference has been reduced.

25. A method of manufacturing a semiconductor device, comprising the steps of:
   forming a pattern element on a semiconductor substrate or an interlayer insulating film;
   depositing a silicon oxide film on said semiconductor substrate so that said pattern element is covered therewith and a surface level difference is formed thereon;
   performing wet chemical etching on a surface of said silicon oxide film to reduce said surface level difference to equal or less than 400 nm; and
   polishing said silicon oxide film, by employing a slurry which contains cerium dioxide, after said surface level difference has been reduced.

* * * * *